United States Patent [19]
Koike

[11] Patent Number: 5,148,034
[45] Date of Patent: Sep. 15, 1992

[54] ION IMPLANTATION METHOD
[75] Inventor: Yukio Koike, Nirasaki, Japan
[73] Assignee: Tokyo Electron Limited, Tokyo, Japan
[21] Appl. No.: 511,236
[22] Filed: Apr. 19, 1990
[30] Foreign Application Priority Data
 Apr. 21, 1989 [JP] Japan .................................. 1-102859
[51] Int. Cl.[5] .............................................. H01J 37/30
[52] U.S. Cl. .................. 250/492.2; 250/398; 250/251
[58] Field of Search ............... 250/492.21, 492.2, 398, 250/251

[56] References Cited
U.S. PATENT DOCUMENTS

| | | | |
|---|---|---|---|
| 3,175,820 | 3/1965 | Schiler | 269/900 X |
| 4,463,255 | 7/1984 | Robertson et al. | 250/492.2 |
| 4,494,005 | 1/1985 | Shibata et al. | 250/492.2 |
| 4,916,311 | 4/1990 | Fugishita et al. | 250/492.2 |

Primary Examiner—Jack I. Berman
Attorney, Agent, or Firm—Oblon, Spivak, McClelland, Maier & Neustadt

[57] ABSTRACT

A method of ion implantation of a semiconductor devices to neutralize electrostatic charge stored on a wafer. Neutralizing electrons are supplied to a passage through which a positive ion beam is passed while forming a barrier of negative electrostatic potential between an area in the passage to which the neutralizing electrons are supplied and the wafer. When the positive ion beam is not present in the passage, the potential of the barrier is set lower than the negative potential corresponding to energy held in the neutralizing electrons. When the beam is not passed through the passage, most of the neutralizing electrons cannot cross over the barrier, but when the beam is passed through the passage, most of the electrons can cross over the barrier, following it, to shower over the wafer.

12 Claims, 5 Drawing Sheets

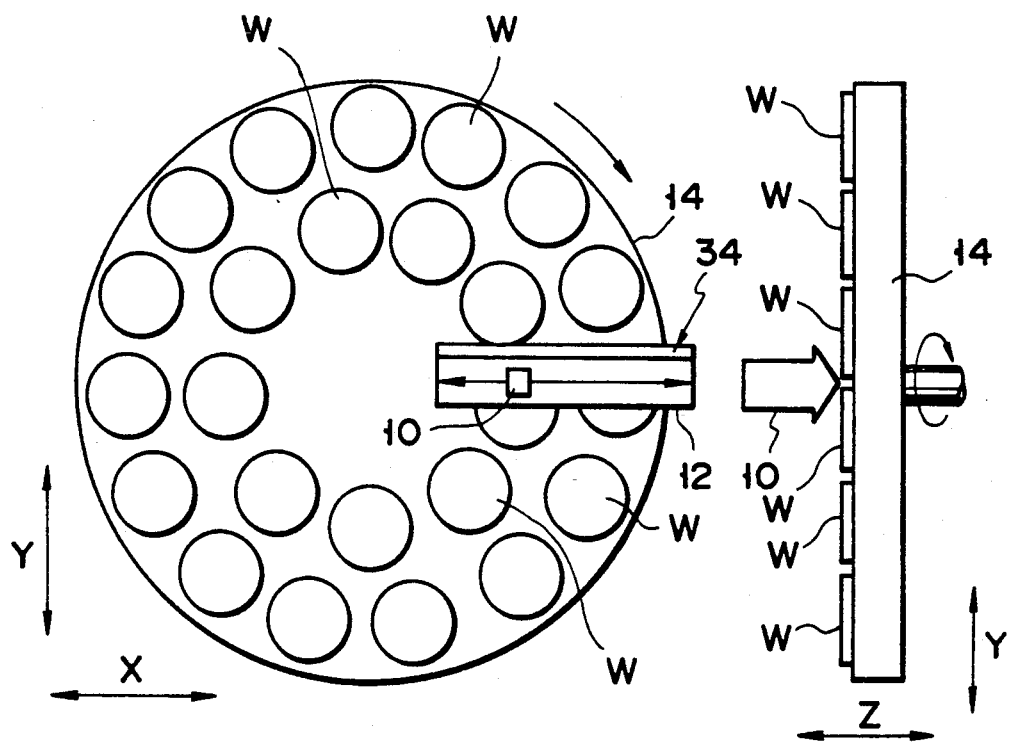
F I G. 3   F I G. 4
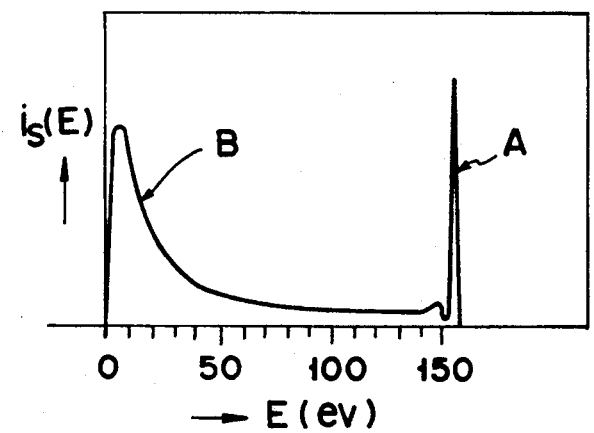
F I G. 5

ION IMPLANTATION METHOD

BACKGROUND OF THE INVENTION

1. Field of the Invention

The present invention relates to an ion implantation method employed in the course of manufacturing semiconductors and, more particularly, an ion implantation method of neutralizing electrostatic charge induced on matters such as semiconductor wafers to be processed.

2. Description of the Related Art

The ion implantation system has been widely used to dope ions particularly to semiconductor wafers because the amount and depth of ions implanted can be controlled with high accuracy.

Positive ions are struck against a semiconductor wafer at high speed in the doping process in which the ion implantation system is used. Electrons are thus driven out of the wafer and positive charge is stored at the insulating layer (or insulated devices) on the wafer. The surface of the semiconductor wafer is thus charged positive and the insulating layer thereof suffers breakdown by discharge (the so-called dielectric breakdown or electrostatic discharge damage). As a result, the product yield of semiconductor elements is reduced accordingly.

In order to prevent the semiconductor wafer from being charged positive, electrons shower over the positive charge build up on the surface of the semiconductor wafer and neutralize positive charge on the wafer. This is the so-called electron shower system.

As shown in FIG. 1, in the case of the conventional electron shower system, an electron beam flooding system section 34 is arranged between an ion supply source (not shown) an semiconductor wafers W to flood electron beams 22. When the positive charge is transported by an ion beam 10 to the semiconductor wafers W, a filament 18 is heated by Joule heating in the section 34 to generate thermoelectrons. A reflector 24 is located on the backside of the filament 18 because the thermoelectrons are emitted from the filament 18 in all directions. Reverse bias voltage is applied from a power supply 26 to the reflector 24 and almost all of the thermoelectrons thus generated are reflected in a desired direction by the reflector 24 to be used as beam of primary electrons 22.

Voltage of minus 200 to 300V is applied from another power supply 20 to between the filament 18 and the guide 12. The thermoelectrons are thus accelerated to high speed primary electrons 22 and when these primary electrons strike the inner wall of the beam guide 12, secondary electrons of low energy are ejected from the wall and shower over the semiconductor wafers W on a rotating disk 14. As a result, the positive charge accumulated on the wafers by the ion beam 10 is neutralized by the secondary electrons compensated.

In the case of the conventional electron shower system, however, the diameter of the ion beam 10 is much smaller than that of the wafer W and smaller than the secondary electron shower. The secondary electrons shower over a quite wide area. This causes the secondary electrons to shower over that part of the wafer to which the ion beam 10 is not transported and the area thus results in negative charging. This negative charging of parts of the wafer W results in destruction of the devices on those parts of the wafer W.

When the conventional neutralizing system described above is employed, therefore, both of positive and negative charging cannot be prevented to the whole of the surface of the wafer at the same time.

SUMMARY OF THE INVENTION

The object of the present invention is therefore to provide an ion implantation method capable of neutralizing charge all over the surface of wafer W.

After many tries and errors, inventors of the present invention have invented a system for supplying secondary electrons (or neutralizing electrons) only to that area of a wafer to which the positive ion beam is transported. When this system is used, therefore, excessive negative charging by the neutralizing electrons on the area of the wafer W outside of the beam can be avoided.

According to an aspect of the present invention, an ion implantation method comprises supplying neutralizing electrons to a passage through which a positive ion beam passes, while forming a barrier of negative electrostatic potential between an area to which the neutralizing electrons are supplied and an object. The potential of the negative electrostatic barrier is lower in this case than the negative potential of the neutralizing electrons. When the positive ion beam is not passed through the passage, the neutralizing electrons cannot cross over the barrier of negative electrostatic potential. When the positive ion beam is passed through the passage, however, the neutralizing electrons can be assisted by the positive ion beam to cross over the barrier and to radiate onto the object.

Therefore, the barrier of negative electrostatic potential is broken out by positive potential of the ion beam.

If the negative potential of the barrier is set too low, the barrier is not broken out by the positive ion beam, so that neutralizing electrons cannot pass through the barrier.

The positive ion beam and the matter (or semiconductor wafer W) move relative to each other on a plane defined by X and Y. In a moment, therefore, the ion beam is present only at a predetermined area inside the ion beam guide and it does not impinge at all on those wafers which are not on the predetermined area.

The area to which the neutralizing electrons are supplied is shielded from the semiconductor wafers W by the barrier of negative electrostatic potential. As long as the barrier of negative electrostatic potential is not broken by the positive ion beam. Therefore, the neutralizing electrons cannot cross over the barrier to the side of the wafers W. The neutralizing electrons can reach the wafers only at the ion-beam-impinged area but not at the ion-beam-not-impinged area. As a result, electrostatic charge accumulated on the wafers W can be neutralized at the impinged area while the wafers W can be prevented from being charged negative at the not-impinged area.

It may be arranged that the negative potential of the negative electrostatic barrier is lower than that corresponding to at least energy held in the neutralizing electrons. When the negative potential of the barrier is set too low, however, the amount of neutralizing electrons (or secondary electrons) which cross over the barrier to the side of the wafers W at the time when the ion beam passes through the passage inside the beam guide is reduced.

The forming of the negative electrostatic barrier is influenced by energies of the ion beam and neutralizing electrons and the size of the beam passage. In an ion implantation system of the large current type, for example, when secondary emission electrons shower is used it is preferable that the negative potential of the barrier is set lower than 50 eV at the center area of the beam guide.

It is preferable that the target area against which primary electrons are struck is made as wide as possible. The reason resides in generating a large number of secondary (or neutralizing) electrons of low energy.

When the net charge transported onto a wafer (or sum of charges of positive ions and neutralizing electrons) is measured by an ion beam ammeter, the potential of negative electrostatic electrode can be controlled to an optimum range on the basis of this measured value.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 3 is a front viewing an ion impinging in a system from a side of a beam guide to show a position of an ion beam relative to a rotating disk;

FIG. 4 is a side view showing a rotating disk at an ion impinging section in a system;

FIG. 5 is a graph showing an energy distribution of secondary electrons ejected or emitted;

DETAILED DESCRIPTION OF THE PREFERRED EMBODIMENTS

An ion implantation system comprises ions extracting analyzing, accelerating, focusing and deflecting sections and an ion impinging section. The ions extracting section includes an ion source and the ion impinging section includes a rotating disk on which wafers are held. A beam guide 12 extends from the ions extracting section to the ion impinging section. A Faraday cup divided every electrode constitutes the beam guide 12.

As shown in FIG. 3, a beam passage of the guide 12 has an elongated and rectangular section when it is sectioned along the longitudinal axis of the guide 12. An ion beam 10 is reciprocated in the beam passage of the guide 12 in a direction X perpendicular to the ion beam 10 shot.

As shown in FIG. 4, the positive ion beam 10 generated in the ion source is transported to the beam guide 12 from its ions extracting section to its ion impinging section and then impinged on silicon wafers W in a direction Z. A plurality of the silicon wafers W are fixed onto the rotating disk 14 at the ion impinging section.

Figure 1:
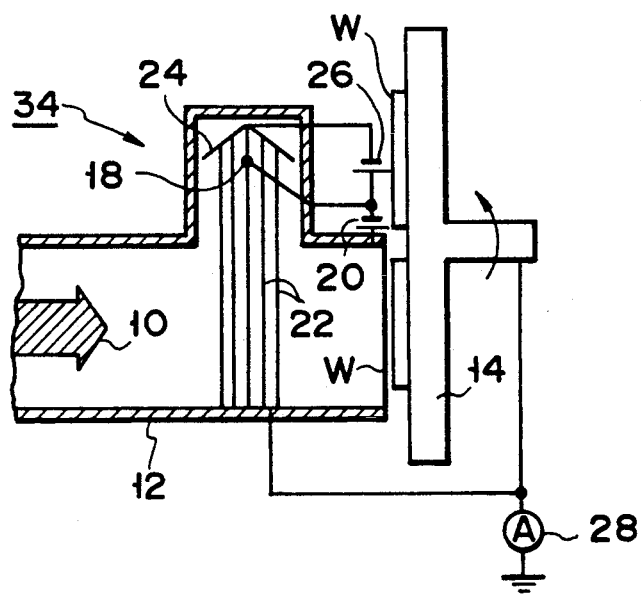
FIG. 1 is a partly-sectioned view showing an ion impinging section in the system with which the conventional ion implantation method is carried out.
Figure 2:
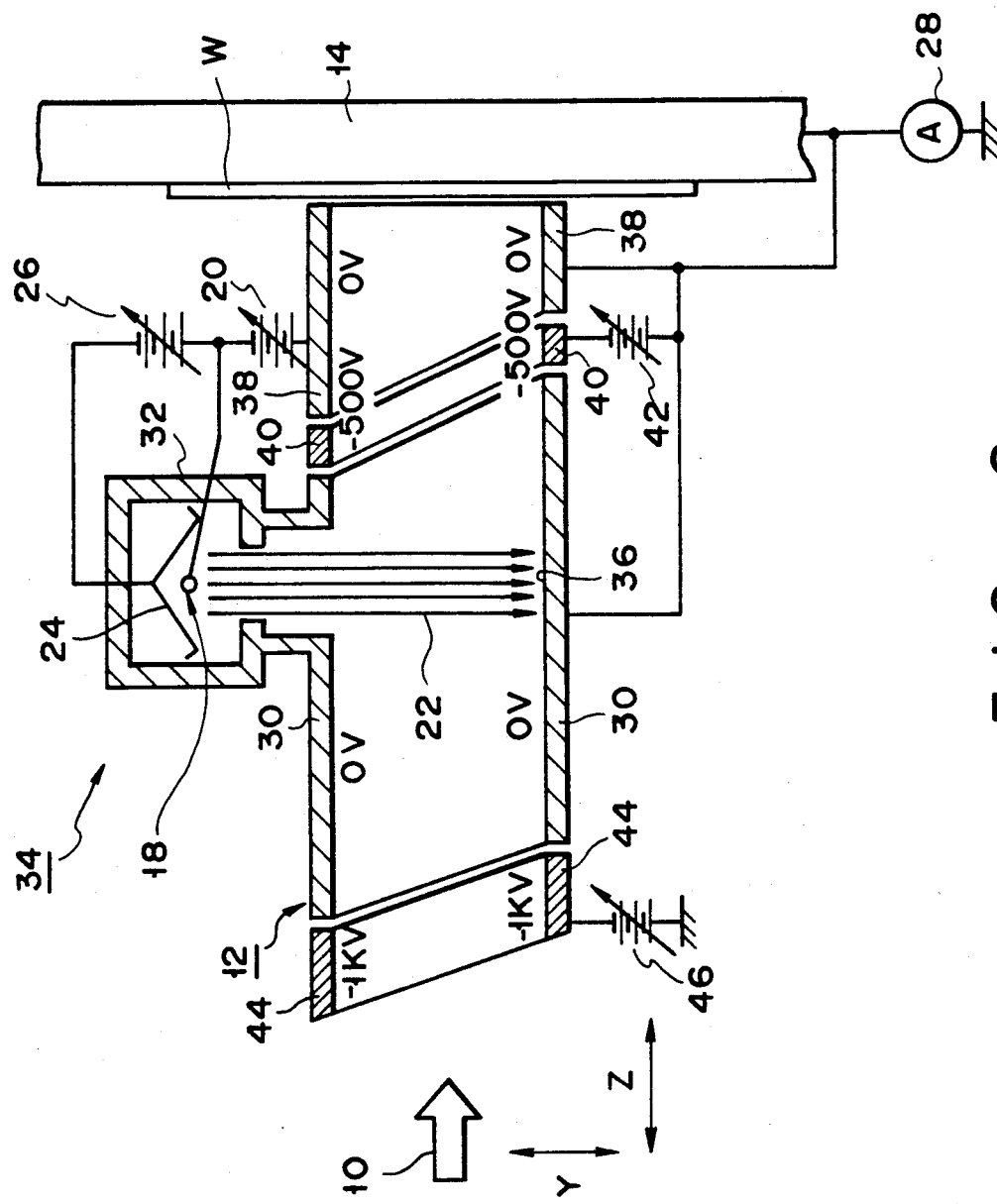
FIG. 2 is a partly-sectioned view showing an ion impinging section in a system with which an ion implantation method of the present invention is carried out.

As shown in FIG. 2, first and second zero potential electrodes 30 and 38 are located in front of the rotating disk 14 at the ion impinging section. These zero potential electrodes 30 and 38 form parts of the beam guide 12, and the second zero potential electrode 38 is located nearest the rotating disk 14. An ammeter 28 is connected to an earthed circuit which includes the first and second zero potential electrodes 30, 38 and the rotating disk 14. The ammeter 28 serves to measure ion beam current.

A recess 32 of an electron flooding section 34 is connected to one side wall of the first zero potential electrode 30. A filament 18 and a reflector 24 are located in the recess 32. The filament 18 is shaped like winding wire around a rod, extending along the longitudinal axis of the electron beam flooding section from one end to the other end thereof.

A DC variable power supply 20 is connected between the filament 18 and the second zero potential electrode 38. This power supply 20 serves to accelerate thermoelectrons created by the filament 18 to primary electrons of high energy.

Another DC variable power supply 26 is connected between the filament 18 and the reflector 24. This power supply 26 serves to turn the thermoelectrons created by the filament 18 into a beam which is directed to a target 36. The target 36 is provided on an inner wall of the first zero potential electrode 30.

An electrode 40 for setting negative electrostatic potential is arranged between the first 30 and the second zero potential electrode 38. The position of the electrode 40 is intended to make the area of the target 36 as large as possible on the inner wall of the first zero potential electrode 30. A DC variable power supply 42 is connected to the electrode 40 on the minus side thereof while to the ammeter 28 of the earthed circuit on the plus side thereof. A voltage of minus 500V, for example, is applied to the electrode 40 by the power supply 42.

An electrode 44 which is a part of the beam guide 12 at the ion impinging section thereof and which serves to suppress electrons is located on that side of the ion impinging section through which the ion beam 10 enters. The minus side of a DC variable power supply 46 is connected to the electrode 44. This power supply 46 applies a voltage of minus 1KV, for example, to the electrode 44. The plus side of the power supply 46 is earthed. The plus side of the power source 46 may be instead connected to the plus side of the ion beam ammeter 28, as seen in the case of the power supply 42.

As shown in FIGS. 3 and 4, a plurality of the silicon wafers W are regularly arranged on the rotating disk 14 along two circle lines coaxial to the shaft of the disk 14. The beam guide 12 extends from the central portion of the disk 14 to the rim thereof. The length of the beam guide 12 in the direction X is substantially equal to the radius of the rotating disk 14. The electron beam flooding section 34 is along the beam guide 12.

A case where the silicon wafers W are doped by positive ions will be described referring to FIGS. 5 through 7.

(I) 24 sheets of the silicon wafers W are fixed onto the disk 14, which is then rotated at a speed of 1000 rpm.

(II) The power supply 42 is switched on to apply a voltage of minus 500 V to the electrode 40. A barrier of negative electrostatic potential is thus created.

(III) The filament 18 is heated by Joule heating to create thermoelectrons, which are accelerated to primary electron beams 22 by the power supply 20 and struck against the target 36. Secondary electrons are thus emitted from the target 36. It is preferable that the surface of the target 36 is made as wide as possible to emit a large number of the secondary electrons.

FIG. 5 is a graph showing the energy distribution of secondary electrons emitted, in which the energy level of secondary electrons is plotted on the horizontal axis while the number of the secondary electrons at each of the energy levels is plotted on the vertical axis. Symbol (A) represents the energy distribution of reflected primary electrons and symbol (B) denotes that of secondary electrons whose number distribution versus kinetic energy is maximal below 50 eV. As apparent from FIG. 5, the secondary electrons are quite larger in number when their energy becomes lower than 50 eV.

Figure 6:
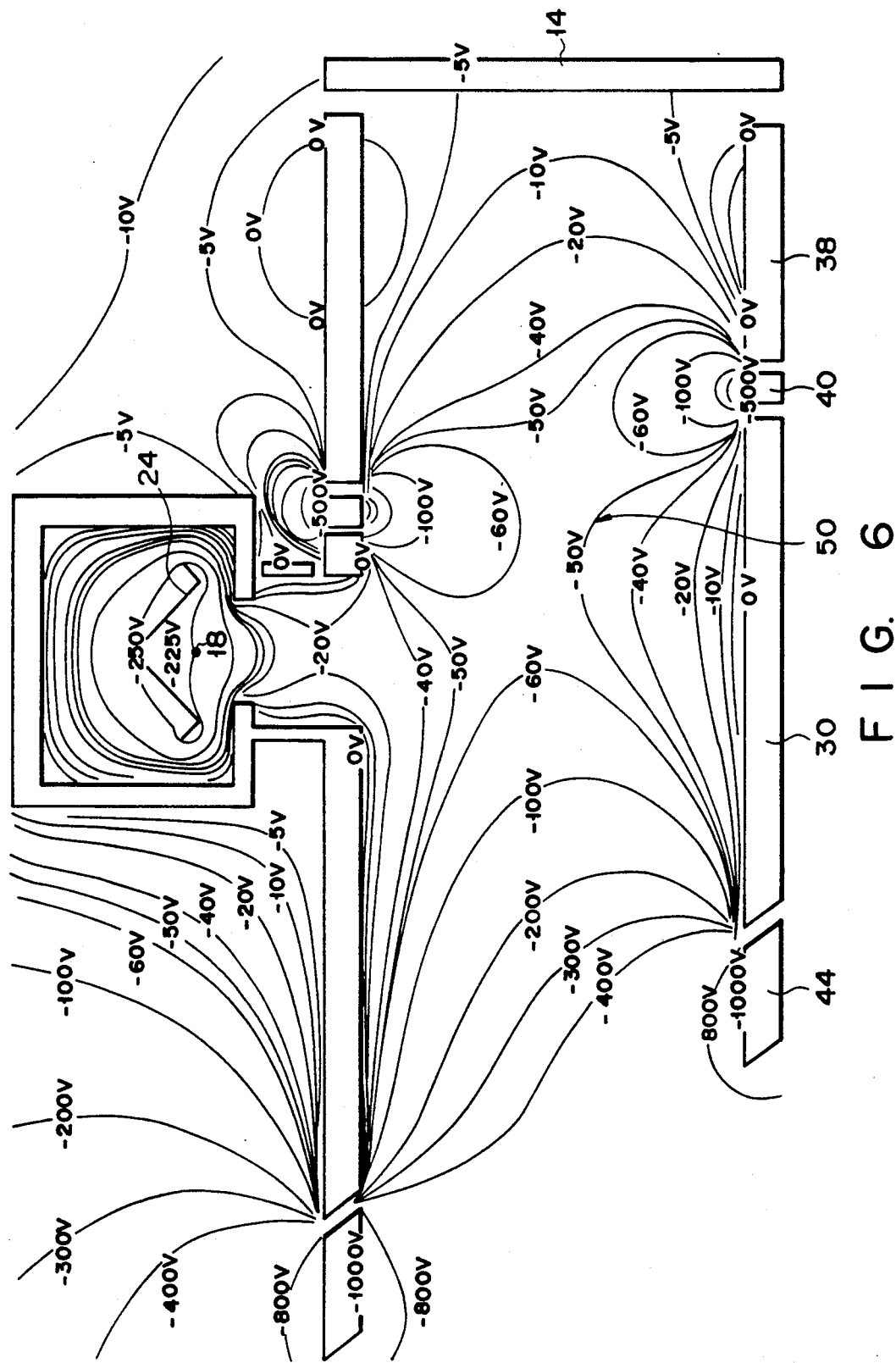
FIG. 6 is a semi diagrammatical vertical section view showing the distribution of electrostatic potentials at various parts of a beam guide when no ion beam is passed through a beam guide.

(IV) As shown in FIG. 6, the barrier of negative electrostatic potential has a potential line 50 of minus 50 eV at the center area of the beam guide 12. The secondary electrons whose energy is lower than minus 50 eV cannot therefore cross over the barrier of negative electrostatic potential to reach the silicon wafers W on the disk 14.

(V) The power source 46 is switched on to apply a voltage of minus 1 KV to the electrode 44. A barrier of negative electrostatic potential is formed in the beam guide 12 on that side of the ion impinging section through which the ion beam 1 enters. This barrier has a line of electrostatic potential lower than the negative potential of the line 50. The secondary electrons emitted from the target 36 can be thus prevented from leaking outside the beam guide 12. When the ion beam 10 passes through the beam guide 12, therefore, no error is caused as to values measured by the ion beam ammeter 28.

(VI) The power supply for the ion source is switched on, and is applied to the ion source to create positive ions. The positive ions are extracted by an electrode at the ions extracting section and transported into the ions analyzing section. Ions having a desired quality are picked up at the analyzing section and then accelerated to the beam 10 of accelerated ions, which have a certain energy, at the ions accelerating section. The ion beam 10 is adjusted to have a predetermined diameter at the focusing section and reciprocated in the direction X at the deflecting section.

Figure 7:
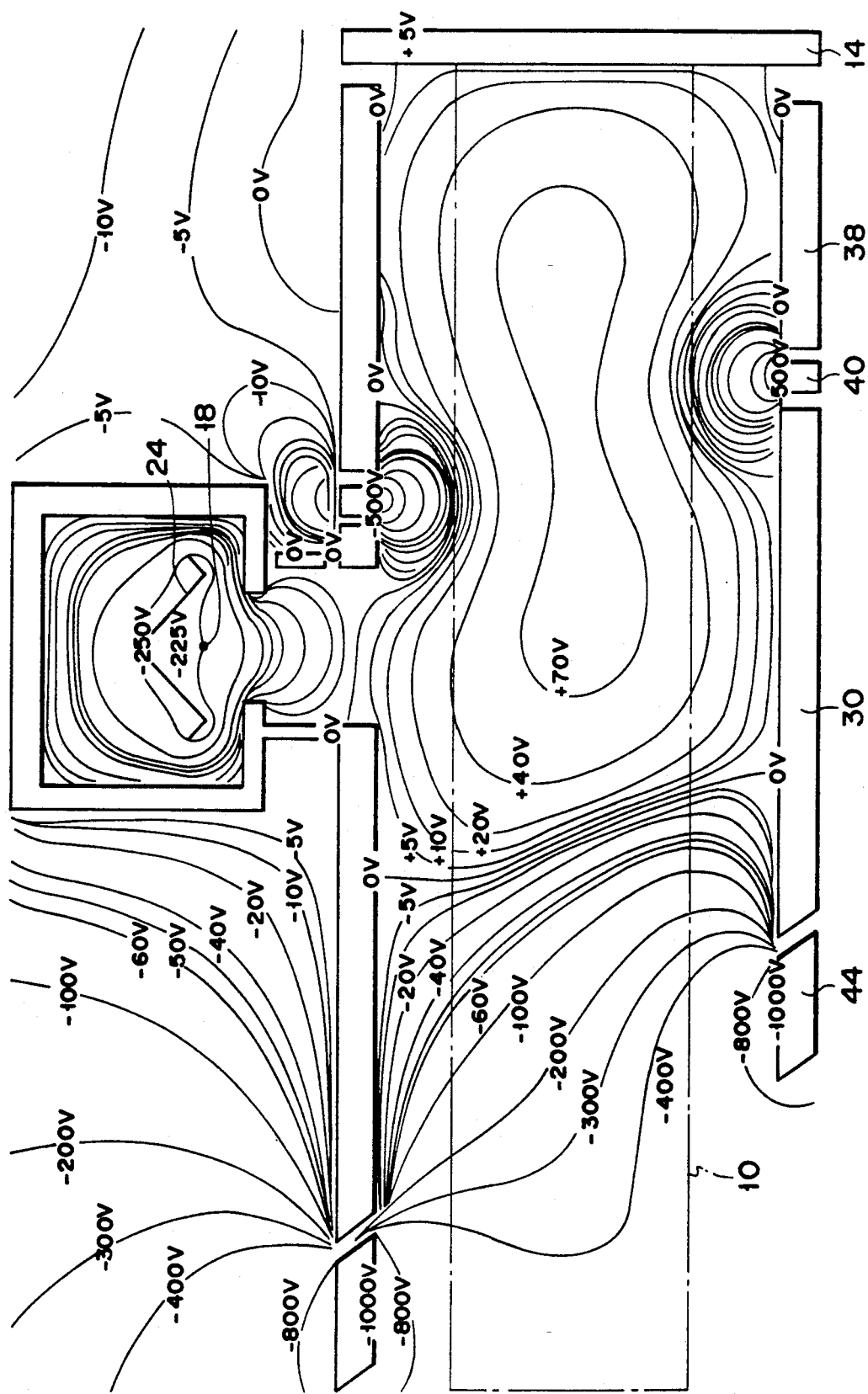
FIG. 7 is a semi diagrammatical vertical section view showing the distribution of electrostatic potentials at various parts of a beam guide when an ion beam is passed through a beam guide.

(VII) As shown in FIG. 7, when the ion beam 10 passes through the beam guide 12 at the ion impinging section thereof, the barriers of negative electrostatic potential are broken by the ion beam 10 and secondary electrons are jumped together with the ion beam 10 to the side of the disk 14. The secondary electrons are struck against the semiconductor wafer W on the disk 14, following the ion beam 10, so that only the area of the wafers W which is impinged by the ion beam 10 can be neutralized by the secondary electrons. The secondary electrons are prevented this time from reaching the other area (non-impinged area) of the wafer W which is not impinged by the ion beam 10 by the barrier of negative electrostatic potential formed by the electrode 40.

It may be arranged that the total of charge (or sum of positive ions and neutralizing electrons) transported on the semiconductor wafer W is measured by the ion beam ammeter 28 and that the potentials of the negative electrostatic electrodes are controlled to an optimum range on the basis of this value measured.

According to the above-described embodiment of the present invention, the barrier of negative electrostatic potential is formed between the electron beams flooding section 34 and the disk 14. The neutralizing electrons can be thus transported only to the ion beam impinged area of the wafer W while preventing them from excessively reaching the wafer W.

According to the present invention, the secondary electrons are emitted only on the ion-beam impinged area of the wafer W. This prevents the ion-beam impinged area of the wafer from positive charge build up and the not-impinged areas thereof from negative charge build up. Therefore, the insulating layer of the semiconductor wafers can be prevented from dielectric breakdown and the yield of the semiconductor devices can be increased to a greater extent.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. An ion implantation method, comprising:
    supplying neutralizing electrons to a passage through which a positive ion beam passes, while forming a first barrier of negative electrostatic potential in a region of the passage between where the neutralizing electrons are generated, and an object to be implanted, and
    setting the potential of the first negative electrostatic barrier lower than the negative potential corresponding to energy held in most of the neutralizing electrons, when said positive ion beam is not present in said passage;
    generating thermoelectrons in a recessed region of an ion implantation apparatus, said recessed region being recessed from a drift region through which an ion beam of said apparatus passes, thereby blocking thermoelectrons generated in said recessed region from said object to be implanted;
    impacting the thermoelectrons onto a surface, thereby emitting secondary electrons; and
    whereby when the positive ion beam is not passed through the passage, most of the neutralizing electrons cannot cross the first barrier of negative of electrostatic potential and when the positive ion beam is passed through the passage, most of the neutralizing electrons can cross the first barrier, following the positive ion beam, to shower over the object.

2. The method according to claim 1, whereby the first barrier of negative electrostatic potential is formed remote from an area where the neutralizing electrons are emitted.

3. The method according to claim 1, whereby the total charge transported onto the object is measured and potentials of electrostatic electrodes are controlled on the basis of the measured total charge.

4. The method according to claim 1, whereby a second barrier of negative electrostatic potential is formed between an ion generating source and the neutralizing electron supply section to prevent the neutralizing electrons from leaking outside the ion beam passage.

5. The method according to claim 4, whereby the potential of the second negative electrostatic barrier formed between the ions generating source and the neutralizing electrons supply section is lower than that of the first negative electrostatic barrier.

6. The method according to claim 1, wherein the positive ion beam is moved relative to the object.

7. The method according to claim 6, wherein the object is mounted on a disk and is rotated together with the disk.

8. The method according to claim 1, wherein the positive ion beam is moved relative to the barrier of the negative electrostatic potential.

9. The method according to claim 8, which further comprises providing a beam passage and a filament for generating said thermal electrons, the positive ion beam being scanned along a scanning direction within said beam passage, the filament arranged parallel to the scanning direction.

10. The method according to claim 1, wherein said step of supplying neutralizing electrons further comprises:
 accelerating said thermal electrons into a large area beam; and
 impacting the large area beam of electrons onto a surface, thereby emitting secondary electrons into a large area of said drift region, wherein said secondary electrons have a number distribution versus kinetic energy which is maximal below 50 electron volts.

11. An ion implantation method according to claim 1, wherein the step of forming a first barrier of negative electrostatic potential further comprises:
 locating a selected electrode in a region of the passage between where the neutralizing electrons are generated and said object to be implanted,
 charging said selected electrode to a negative potential, thereby producing said first barrier of negative electrostatic potential.

12. An ion implantation method, comprising:
 supplying neutralizing electrons to a passage through which a positive ion beam passes, while forming a first barrier of negative electrostatic potential in a region of the passage between where the neutralizing electrons are generated, and an object to be implanted;
 setting the potential of the first negative electrostatic barrier lower than the negative potential corresponding to energy held in most of the neutralizing electrons, when said positive ion beam is not present in said passage;
 generating thermal electrons in an ion implantation apparatus,
 impacting the thermal electrons onto a surface, thereby emitting secondary electrons into an area of said drift region, wherein said secondary electrons have a number distribution versus kinetic energy which is maximal below 50 electron volts; and
 whereby when the positive ion beam is not passed through the passage, most of the neutralizing electrons cannot cross the first barrier of negative electrostatic potential and when the positive ion beam is passed through the passage, most of the neutralizing electrons can cross the first barrier, following the positive ion beam, to show over the object.

* * * * *